United States Patent [19]
Hsieh

[11] Patent Number: 5,989,986
[45] Date of Patent: Nov. 23, 1999

[54] METHOD TO INHIBIT THE FORMATION OF ION IMPLANTATION INDUCED EDGE DEFECTS

[75] Inventor: Yong-Fen Hsieh, Hsin-Chu, Taiwan

[73] Assignee: United Microelectronics Corp., Hsinchu, Taiwan

[21] Appl. No.: 08/857,733

[22] Filed: May 16, 1997

[51] Int. Cl.⁶ .................................................. H01L 21/265
[52] U.S. Cl. ........................................... 438/514; 438/524
[58] Field of Search .................................... 438/510, 514, 438/515, 518, 524, 533, 534

[56] References Cited

U.S. PATENT DOCUMENTS

| | | | |
|---|---|---|---|
| 4,748,103 | 5/1988 | Hollinger | 438/527 |
| 4,968,634 | 11/1990 | Kuhlmann | 438/514 |
| 5,217,924 | 6/1993 | Rodder et al. | 438/533 |
| 5,424,222 | 6/1995 | Arndt | 438/515 |
| 5,482,876 | 1/1996 | Hsieh et al. | 438/303 |
| 5,498,556 | 3/1996 | Hong et al. | 438/305 |
| 5,523,244 | 6/1996 | Vu et al. | 438/370 |
| 5,552,331 | 9/1996 | Hsu et al. | |

OTHER PUBLICATIONS

Tamura, et al., "Lattice Defects Generated by Ion Implantation Into Submicron Si Areas," Mat. Res. Soc. Symp. Proc., vol. 147, 1989, pp. 143–154.

C.H. Chu, et al., "Structural Damage Induced by Ga ⁺Focused Ion Beam Implantation in (001) Si," J. Vac. Sci. Technol. B 9 (6), Nov./Dec. 1991, pp. 3451–3455.

M. Tamura, et al., "Mask–Size Dependence of Lattice Defects Generated by B–And As–Implantation Into Submicron Si Areas," Nuclear Instruments and methods in Physics Research B32/38, 1989, pp. 329–335.

H. Cerva, et al., "Defect Formation in Silicon at a mask Edge During Crystallization of an Amorphous Implantation Layer," J. Appl. Phys., vol. 66, No. 10, Nov. 15, 1989, pp. 4723–4728.

M. Horiuchi, et al., "Gate–Edge Effects on SPE Regrowth From As⁺–Implanted Si," Nuclear Instruments and Methods in Physics Research B37/38, 1989, pp. 285–289.

B.Y. Tsui, et al., "Impact of Structure Enhanced Defects Multiplication on Junction Leakage," IEEE/IRPS, 1994, pp. 383–387.

M. Horiuchi, et al., "Three–Dimensional Solid–Phase–Epitaxial Regrowth From As⁺ –Implanted Si," J. Appl. Phys. 65 (6), Mar. 15, 1989, pp. 2238–2242.

Y.F. Hsieh, "Generation of Implantation Induced Tertiary Defects," Submitted to JAP, Jul. 1994, pp. 1–20.

*Primary Examiner*—Savitri Mulpuri
*Attorney, Agent, or Firm*—Rabin & Champagne, P.C.

[57] ABSTRACT

A method to determine a desired thickness for a surface layer through which ion implantation will take place in order to control the shape of the implantation profile to minimize the formation of flaws includes choosing a maximum angle $\theta$ between solid phase epitaxial regrowth fronts, determining a projected range of ion implantation distance Rp into the substrate and a projected standard deviation $\Delta$Rp along a first axis direction and a projected standard deviation $\Delta$Y along a second axis direction. These values are then substituted into the following equation to solve for thickness t of the surface layer: $t=Rp+\cos\theta[[(\Delta Y \sin\theta)^2+(\Delta Rp \cos\theta)^2]^{0.5}]$ After the layer is placed onto the substrate, the implantation step is carried out. Annealing is then performed to recrystallize the amorphous zone. The morphology of the surface being implanted through can also be modified in order to control the directions of recrystallization upon annealing.

9 Claims, 8 Drawing Sheets

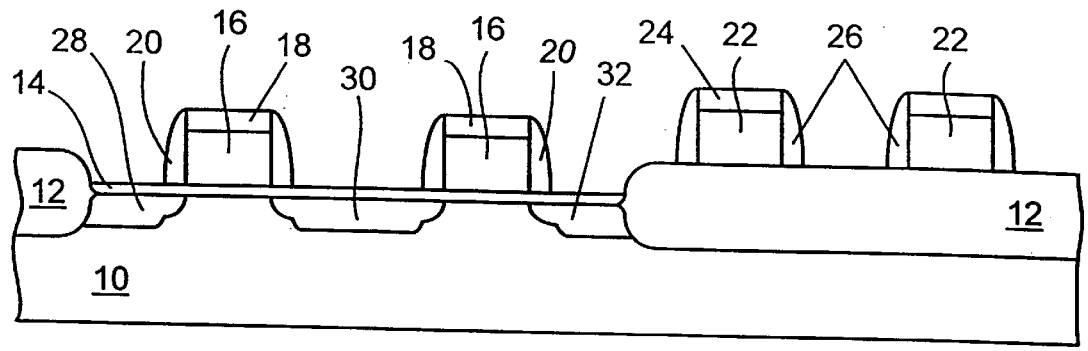
FIG. 1 -- Prior Art
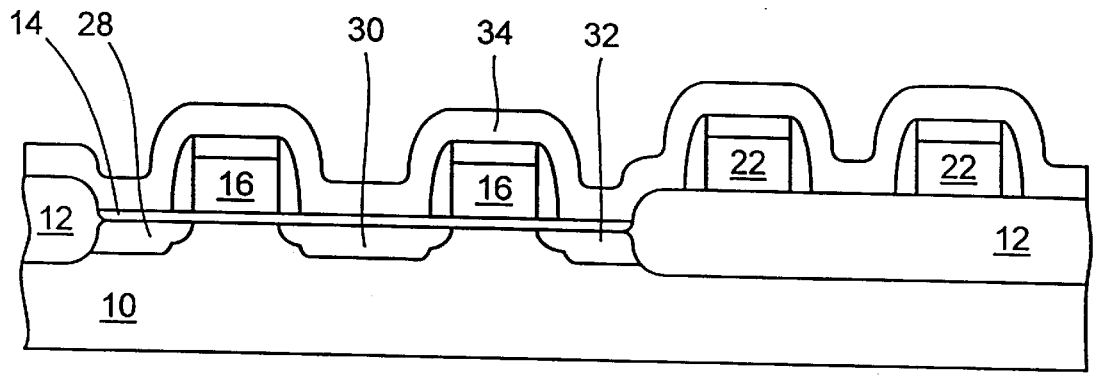
FIG. 2 -- Prior Art
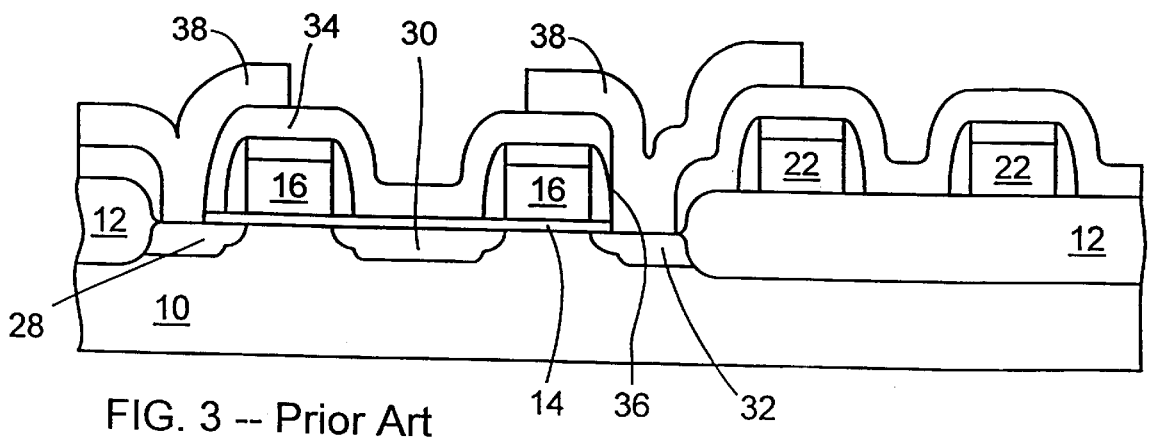
FIG. 3 -- Prior Art

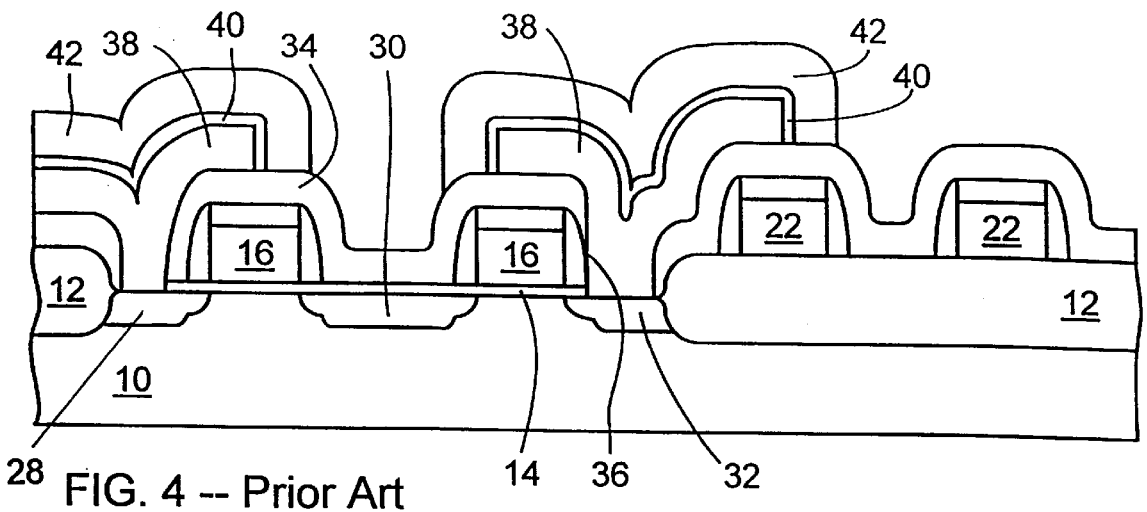
FIG. 4 -- Prior Art
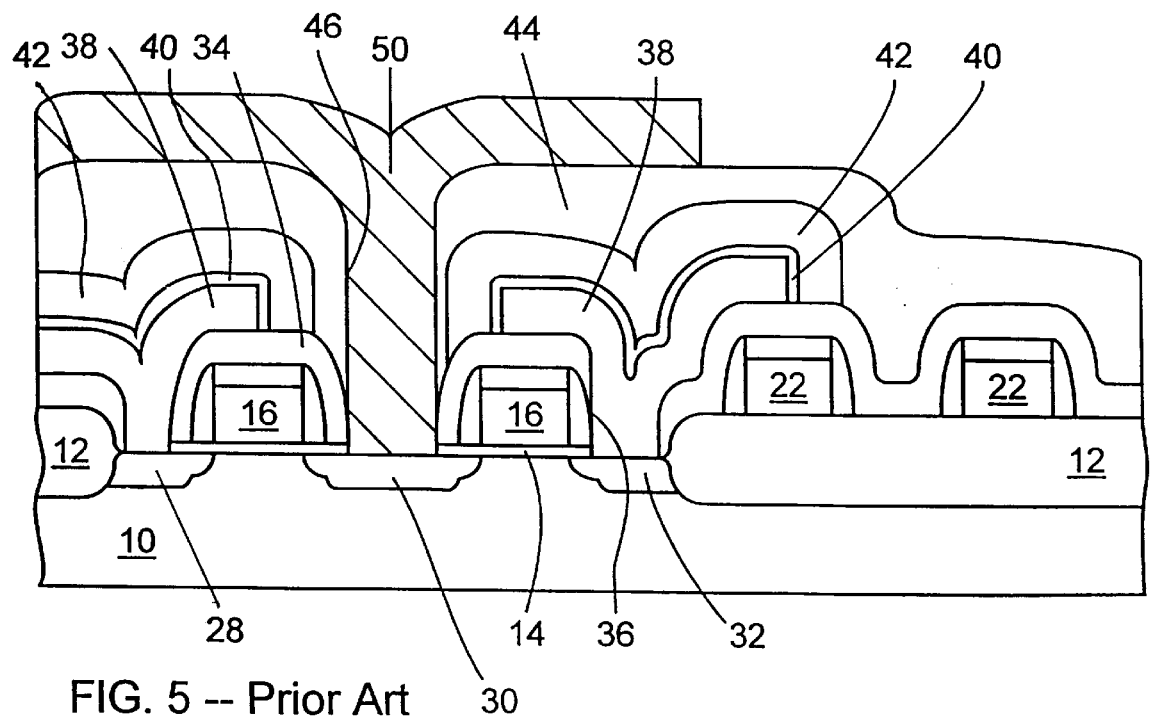
FIG. 5 -- Prior Art

METHOD TO INHIBIT THE FORMATION OF ION IMPLANTATION INDUCED EDGE DEFECTS This application claims priority from provisional application Ser. No. 60/035,547, filed Jan. 10, 1997.

BACKGROUND OF THE INVENTION

1. Field of the Invention.

The present invention relates to a method for reducing the likelihood that defects form during semiconductor device fabrication. More particularly, the present invention relates to a method for limiting defect formation by controlling the morphology of an implantation profile in a semiconductor substrate.

2. Description of the Related Art

There is a continuing trend toward increasing the storage density of integrated circuit memories to provide increased levels of data storage on a single chip. Higher density memories provide storage that is generally more compact and is often cheaper on a per bit basis than an equivalent amount of storage provided on plural chips. It has generally been possible to provide these higher levels of storage at equivalent or improved levels of performance as compared to earlier, less dense chips. Historically, the density of integrated circuit devices has been increased in part by decreasing the size of structures such as wiring lines and transistor gates and by decreasing the separation between the structures which make up the integrated circuit device. Reducing the size of circuit structures is generally referred to as decreasing the "design rules" used for the manufacture of the integrated circuit device.

In dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one. The surface area of the electrodes of the memory capacitors determines the amount of charge that can be stored on each of the capacitors for a given operating voltage, for the electrode separation that can reliably be manufactured, and for the dielectric constant of the capacitor dielectric typically used between the electrodes of the charge storage capacitor. Read and write operations are performed in the memory by selectively coupling the charge storage capacitor to a bit line to either transfer charge to or from the charge storage capacitor. The selective coupling of the charge storage capacitor to the bit line is typically accomplished using a transfer field effect transistor (FET). The bit line contact is typically made to one of the source/drain electrodes of the transfer FET and the charge storage capacitor is typically formed in contact with the other of the source/drain electrodes of the transfer FET. Word line signals are supplied to the gate of the FET to connect one electrode of the charge storage capacitor through the transfer FET to the bit line contact facilitating the transfer of charge between the charge storage capacitor and the bit line.

FIG. 1 shows in schematic cross-section two memory cells of a DRAM at an intermediate stage of manufacture. The illustrated DRAM cells are formed on a P-type substrate 10 and include thick field oxide regions 12 to provide isolation from other, adjacent memory cells. A gate oxide layer 14 is formed by thermal oxidation on part of the active device region between the field oxidation regions and polysilicon gate electrodes 16 are formed on the gate oxide layer 14. The two gate electrodes 16 illustrated in FIG. 1 are part of two independent transfer FETs for the two illustrated memory cells. Polysilicon gate electrodes 16 are formed by depositing a layer of undoped polysilicon over the substrate, typically using low pressure chemical vapor deposition (LPCVD), and then implanting impurities into the polysilicon and activating the impurities to render the polysilicon layer conductive. The gate electrodes are then patterned using conventional photolithography techniques. A layer of silicon oxide 18 is provided over the polysilicon gate electrodes 16 to protect the gate electrodes in subsequent processing steps and, often, to serve as an etch stop for subsequent etching steps. Sidewall oxide spacer structures 20 are also provided adjacent the gate electrodes during the source/drain implantation process (discussed below). At the same time that the gate electrodes 16 are formed, wiring lines 22 which connect different gate electrodes are formed on field oxide regions 12. Because the wiring lines are generally formed in the same process used to form the gate electrodes 16, the wiring lines have a similar structure consisting of polysilicon lines 22 covered by oxide layers 24 with sidewall oxide spacer structures 26 formed alongside the wiring lines 22.

Doped source/drain regions 28, 30 and 32 are formed on either side of the polysilicon gate electrodes 16 to define the channel regions of the transfer FETs. The source/drain region 30 that is common to the transfer FETs will serve as the bit line contact for the two illustrated memory cells. Lightly doped drain (LDD) structures are often used in small design rule memory transistors of the type that are primarily used in modem memory and logic devices. LDD source/drain regions 28, 30 and 32 are typically formed in a two step process, beginning with a relatively low level dopant implantation made self-aligned to the polysilicon gate electrodes 16. Spacer oxide regions 20 are then formed on either side of the gate electrodes 16 by first depositing a layer of CVD oxide over the device and then anisotropically etching back the oxide layer to expose the substrate over the source/drain regions 28, 30 and 32. Etching back the CVD oxide layer produces the spacer oxide regions 20 on either side of the polysilicon gate electrodes 16 and on either side of the polysilicon wiring lines 22. After the spacer oxide regions 20 are provided on either side of the polysilicon gate electrodes 16, a second, heavier ion implantation is made into the source/drain regions 28, 30 and 32 self-aligned to the spacer oxide regions 20 to complete the source/drain regions.

After the formation of the transfer FETs of the DRAM cells, processing continues to form the charge storage capacitors and the bit line contacts by first depositing an insulating silicon oxide layer 34 over the FIG. 1 structure using chemical vapor deposition (CVD). The resulting structure is shown in FIG. 2. Openings 36 are then formed by conventional photolithography through the silicon oxide layer 34 to expose the source/drain regions 28, 32 of the substrate. Referring now to FIG. 3, a layer of undoped polysilicon 38 is next deposited by low pressure chemical vapor deposition (LPCVD) over the surface of the device and within the openings 36 in contact with source/drain regions 28, 32. Polysilicon layer 38 will form part of the lower electrode of the charge storage capacitor for the DRAM memory cells. The layer is doped by ion implantation and annealing and then the lower electrodes 38 are defined by photolithography. A capacitor dielectric layer 40, such as a two layer structure of silicon nitride and silicon oxide, is provided over the surfaces of the lower electrodes 38. Upper capacitor electrodes 42 are formed by depositing, doping and patterning a layer of polysilicon, producing the structure illustrated in FIG. 4.

Processing continues by blanket depositing a layer of interlayer dielectric material, such as a doped glass deposited by atmospheric pressure CVD from a TEOS source gas, over the FIG. 4 structure. A bit line contact 46 is opened through the dielectric layer 44 by conventional photolithography to expose the common source/drain contact 30. The bit line contact 50 is then formed, typically by providing an additional bit line contact ion implantation and then providing one or more layers of metal sputter or CVD deposited over the surface of the layer 44 and within the opening 46 as illustrated in FIG. 5. The bit line is then patterned and further processing is performed to complete the device.

Reducing the design rules used for forming the device illustrated in FIG. 5 places heightened demands on many of the structures illustrated in FIG. 5, along with the processing techniques used for forming the structures. The formation of source/drain regions becomes more critical because of the comparatively shallower and narrower source/drain regions that are incorporated in reduced dimension memory cells. There is a greater need to control implantation energies and the extent of diffusion of source/drain regions to achieve small device sizes. There is also a need to maintain highly conductive source/drain regions to maintain the high performance of these structures. An aspect of maintaining high conduction levels is preventing the formation of defect structures in the source/drain regions.

Several types of crystal lattice defect structures may be formed in the processes of implanting dopant ions into semiconductor substrates and annealing the substrates to activate the implanted dopants. The ion implant doses used in forming many semiconductor circuit components may render amorphous the crystalline silicon semiconductor substrate into which the dopant ions are implanted. The substrate must subsequently be annealed to activate the implantation and often to recrystallize the amorphous zone. Recrystallization of implanted silicon substrates occurs by solid-phase epitaxial (SPE) regrowth. SPE regrowth is a process in which the substrate is heated to a temperature below the melting point of the substrate material. Crystal growth occurs by solid state transport and proceeds over the boundary between the crystalline (implanted or unimplanted) portion of the substrate and the amorphous, implanted region of the substrate. The recrystallization occurs incrementally, with the direction of recrystallization of each incremental amorphous region determined by the orientation of the crystalline region on which the recrystallization takes place. Thus, the orientation of the crystalline substrate at the interface of the crystalline region and the amorphous region will determine the directions of SPE regrowth.

Due to the shape of the boundary of the amorphous region, it is possible for SPE regrowth to proceed along different crystalline planes. Various studies have indicated that SPE regrowth occurring along different crystalline planes can result in the formation of defects in the crystal. For example, the merging of growth fronts corresponding to two different crystal planes can result in the formation of extended defect structures in recrystallized silicon substrates. Other forms of residual defects may be introduced into the crystal lattice, both from implantation and from other processes. For example, the presence of gate layers and sidewall spacer layers on the substrate can introduce compressive stresses on the underlying material, particularly during subsequent thermal processing steps. The presence of such stresses may generate defects such as dislocations and can lead to dislocation multiplication.

Certain types of defects known as projected range defects (PRDs) and end of range defects (ERDs) may be formed in implanted and annealed regions of the substrate. PRDs and ERDs are secondary defects (dislocations or line defects), with PRDs located near the region of maximum implanted ion concentration and ERDs located near the amorphous-crystalline interface after implantation. These defects are believed to result from vertical SPE regrowth of amorphous silicon, that is, regrowth perpendicular to the silicon surface, and the defects may include dislocation loops buried within the implanted region. The location and density of PRDs and ERDs are related to the energy and dose of the implanting ions. Another type of defect related to recrystallization of a silicon made amorphous through ion implantation is the mask edge defect (MED). It is believed that MEDs are dislocations resulting from the merging of recrystallization fronts of vertical and lateral SPE regrowth. During the annealing and recrystallization process, the dislocations formed from the merging SPE regrowth fronts tend to agglomerate as additional epitaxial layers are formed, with the defects growing into a structure that has been described as being similar to a grain boundary. This extended defect structure can affect electron transport if it is positioned along a primary direction of current flow. Such defect structures may be formed near the lateral edges of the implantation zone at or near the substrate surface, often at the location where a recrystallizing substrate surface adjoins another structure on the surface of the substrate, and can lead to junction leakage problems.

SUMMARY OF PREFERRED EMBODIMENTS

Embodiments of the present invention include methods for inhibiting defects formed upon recrystallizing silicon semiconductor substrates made amorphous by, for example, ion implantation. Certain preferred embodiments of the invention include a method for controlling the shape of a recrystallization interface so that SPE (solid-phase epitaxial) regrowth primarily occurs along a set of preferred directions. Specific ones of these embodiments provide a surface layer on the substrate through which ion implantation will take place. The thickness of the surface layer is preferably selected to limit the depth to which ions are implanted in the substrate. Alternately, the thickness, surface topography or other characteristics of the surface layer are chosen so that the boundary between the cyrstalline substrate and the amorphous implanted region has a preferred shape. Appropriate selection of the shape of the implantation profile may limit SPE regrowth to specific preferred directions, reducing the possibility that recrystallization will form defect structures of the sort that can damage performance.

In a particularly preferred embodiment, an appropriate surface layer thickness may be determined by choosing a maximum angle $\theta$ between solid phase epitaxial regrowth fronts to inhbit defects, determining a projected range of ion implantation distance Rp into the substrate, determining a projected standard deviation $\Delta Rp$ along a first axis direction, determining a projected standard deviation $\Delta Y$ along a second axis direction and providing a surface layer thickness t greater than or equal to the value given by:

$$t = Rp + \cos\theta[[(\Delta Y \sin\theta)^2 + (\Delta Rp \cos\theta)^2]^{0.5}].$$

After the surface layer is placed onto the substrate, implantation is carried out. Annealing then activates the implant and recrystallizes any amorphous region.

In other embodiments a bit line contact for a memory device is formed by providing a substrate having a source/drain region. A depression is formed in the substrate and implantation is carried out through the depression into the source/drain region of the substrate to enhance the conductivity of the bit line contact. The implanted region is annealed and a bit line is formed in contact with the source/drain region at the depression on the surface of the substrate.

BRIEF DESCRIPTION OF THE DRAWINGS

Embodiments of the invention are described with reference to the accompanying drawings which, for illustrative purposes, are schematic and are not drawn to scale, where:

FIGS. 1–5 show cross-sectional views of a conventional prior art DRAM at various stages of manufacture.

DETAILED DESCRIPTION OF PREFERRED EMBODIMENTS

A typical bit line contact region 30 as seen in FIG. 5 may be subjected to three ion implantation steps and between one and three annealing steps in a typical manufacturing process. At least one annealing step is usually necessary to electrically activate the dopants and to undo at least some of the lattice damage caused by the ion implantation steps. Typical implantation dosages for high density, shallow junction devices may render a portion or all of the contact region amorphous. Annealing is carried out in such instances to recrystallize the amorphous zone. The recrystallization is believed to proceed through solid-phase epitaxial regrowth (SPE), in which a solid phase transformation occurs through which the amorphous zone is transformed to a crystalline structure through atomic transport and reorganization at the boundary between the amorphous and crystalline regions. Recrystallization may proceed in directions generally perpendicular to the boundary of the amorphous region. Thus, the orientation of each incremental recrystallized region is dependent on the orientation of the crystalline region from which the recrystallization proceeds. As a result, the orientation of the crystalline substrate at the interface between the crystalline portion of the substrate and the amorphous portion determines the crystalline directions along which recrystallization proceeds.

The recrystallization of amorphous silicon regions may cause the formation of a variety of defects. Projected range defects (PRDs) and end of range defects (ERDs) are secondary defects (typically dislocation loops) formed within the implanted region of the substrate during SPE recrystallization of amorphous silicon. PRDs are found near the region of maximum implanted ion concentration and ERDs are found near the amorphous-crystalline interface after implantation. These defects are believed to result from vertical SPE regrowth of amorphous silicon. The location and density of PRDs and ERDs are related to the energy and dose of the implanting ions. Another type of defect related to recrystallization of a silicon made amorphous through ion implantation is the mask edge defect (MeD). MEDs are typically located near the corners of the recrystallized zone under or near mask edges. The formation of MEDs during recrystallization of the amorphous zone is dependent on the direction of crystallographic regrowth. SPE regrowth rates are different along different crystallographic directions, and it is believed that MEDs result from the merge of the recrystallization fronts of both vertical and lateral SPE regrowth.

Figure 6:
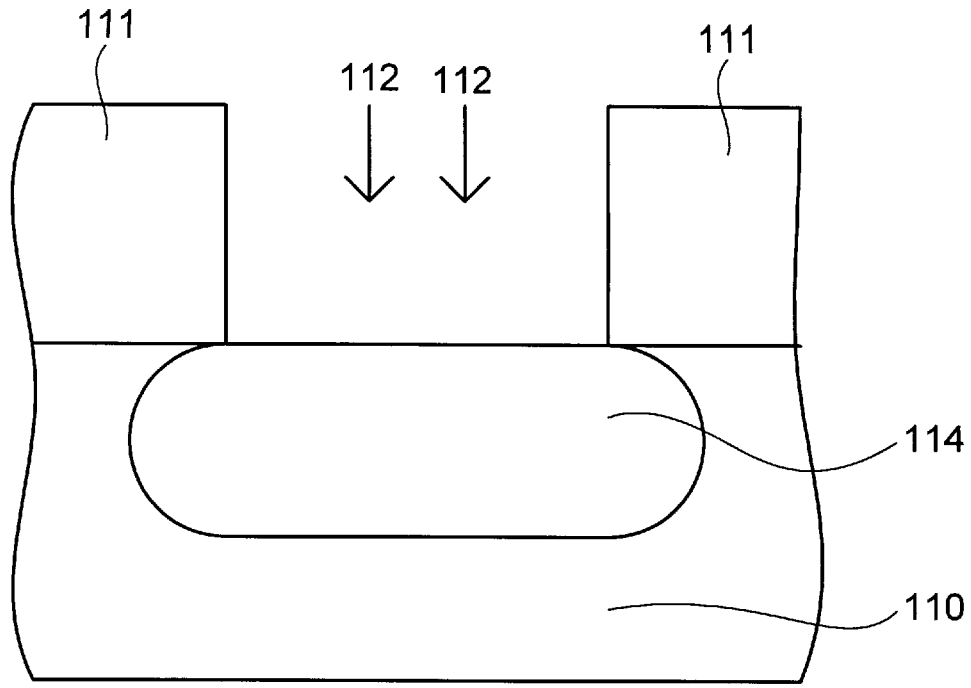
FIG. 6 shows a cross-sectional view of an ion implantation zone for a bit line contact.
Figure 7:
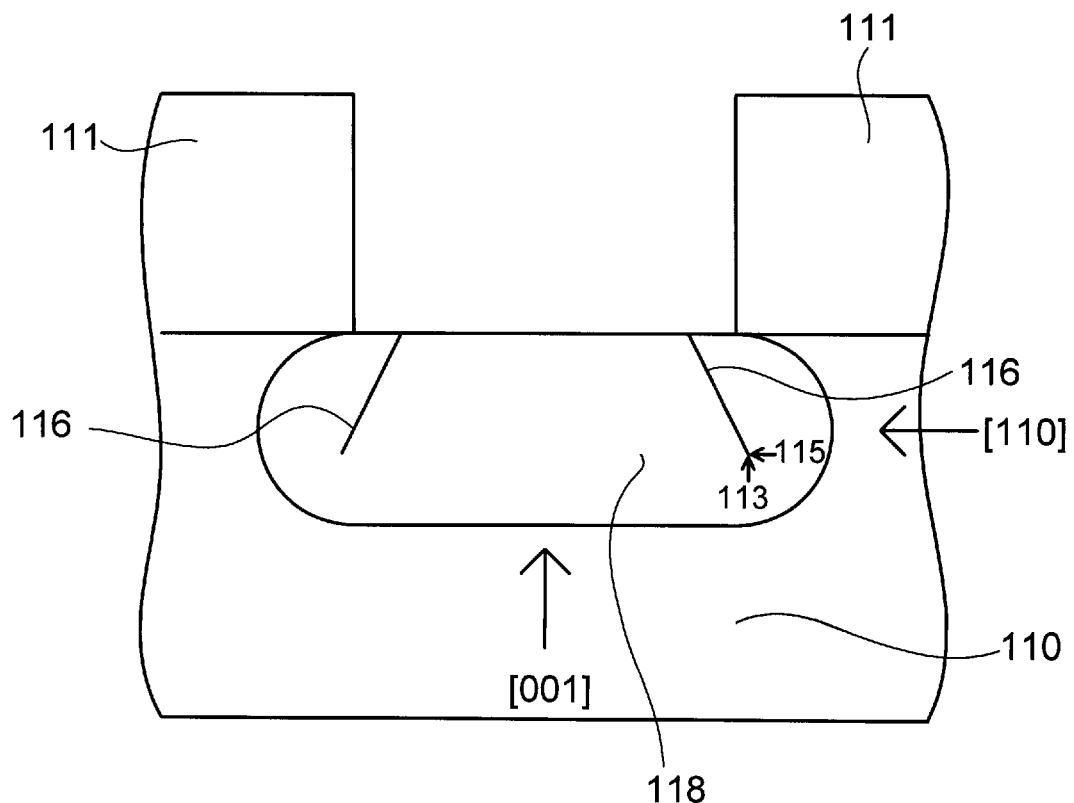
FIG. 7 shows a cross-sectional view of contact edge defects formed during recrystallization and annealing of the implantation zone of FIG. 6.

FIGS. 6 and 7 illustrate the formation of mask edge defects in an implanted and annealed bit line contact region, where ion implantation is carried out on substrate 110 having an implantation area defined, for example, using photolithographic (illustrated) or direct beam writing techniques. The implantation is typically carried out normal to the substrate 110 surface in direction 112, forming implantation and amorphous zone 114. As shown in FIG. 6, the shape of the implantation zone approximates a Gaussian distribution, with a maximum implantation concentration located at the widest portion of the zone 114. After the implantation, an annealing step is performed to recrystallize the amorphous zone 114. During annealing, recrystallization occurs by solid-phase epitaxial (SPE) regrowth along the boundary between the crystalline portion of the substrate and the amorphous region of the substrate. The recrystallization occurs in layers, with the direction of recrystallization of each layer determined by the orientation of the crystalline region on which the recrystallization takes place. Thus, the directions of crystal growth are dependent on the orientation of the crystalline region at the interface.

As seen in FIG. 7, recrystallization may occur in multiple directions, including vertically in the [001] direction and laterally along the [110] direction. Recrystallization generally begins at the interface between the amorphous zone and crystalline regions in the substrate, and occurs at different rates in different directions. As the crystal fronts growing in different directions intersect, defects may be generated and pinned at the intersections between the crystal growth fronts, as illustrated by arrows 113 and 115 in FIG. 7. As the crystal growth proceeds through the amorphous zone, the defects accumulate and are pinned along the planes where the crystal growth fronts intersected during recrystallization, resulting in extended defect structures 116 in the substrate, typically extending near the edge of the surface structures 111.

By controlling the depth and shape of the amorphous zone within the substrate, defect formation such as the defects 116 shown in FIG. 7 can be reduced. Appropriate design of the implant and recrystallization process provides a process which favors particular growth directions in the recrystallization process. In certain embodiments, it is desirable for the directions of regrowth to be dominated by and or limited to directions including the [100], [111], [211], [311] and [511] directions. For example, the angle between the [100] direction and other directions can be readily calculated or measured. The angle between the [100] and [111] directions is about 54.7 degrees for a cubic crystal. It has been found that edge defect formation is inhibited when the angle between regrowth directions is about 54.7 degrees or less for a substrate oriented in the [100] direction. The angle between the [100] direction and the [211], [311], and [511] directions are all less than 54.7 degrees, with the angle between the [100] and [211] directions being about 35.3 degrees, the angle between the [100] and [311] directions being about 25.2 degrees, and the angle between the [100] and [511] directions being about 15.8 degrees. A variety of processes have been developed by the present inventor to ensure that recrystallization will proceed along crystallographic directions that form angles of less than or equal to about 54.7 degrees to the [100] direction.

Figure 8:
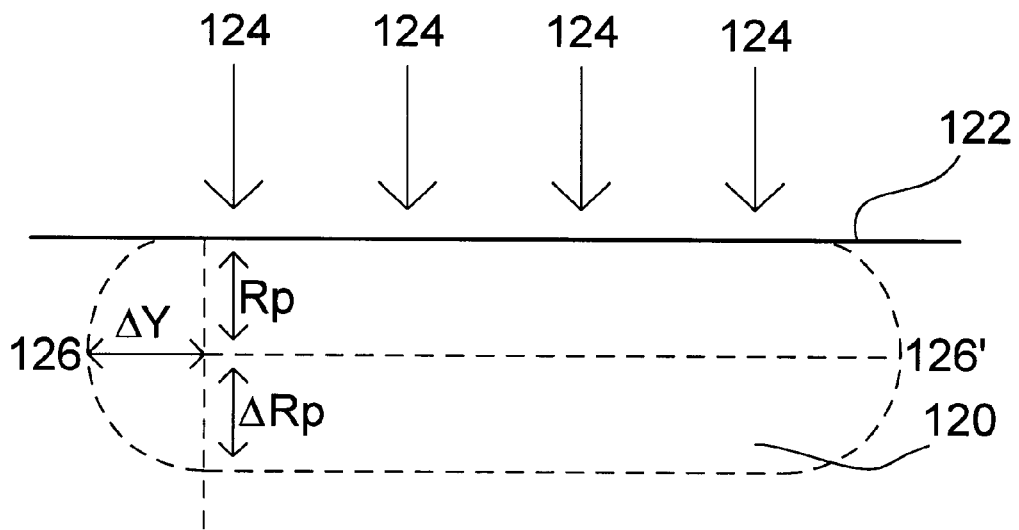
FIG. 8 shows a cross-sectional view of an implantation profile in a substrate having a generally flat surface.

In certain embodiments, a surface layer of a material which could be polysilicon or an insulator such as silicon oxide is placed onto the surface of the substrate so that the implantation zone lies partially within the surface layer and partially within the substrate. The layer may preferably be of substantially uniform thickness. By controlling the thickness of the surface layer, the shape of the recrystallization zone in the substrate can be controlled. An aspect of the invention provides a method for determining a minimum thickness for the surface layer to ensure that crystal regrowth fronts will intersect at an of the user's choosing that is less than the maximum angle between regrowth planes consistent with avoiding formation of extended defect structures. The method is described below with reference to the geometry illustrated in FIG. 8. The ion implantation profile 120 in a direction 124 normal to generally flat substrate surface 122 may be described by a Gaussian distribution, as seen in FIG. 8. The implantation profile 120 extends into the substrate along the direction 124 and spreads laterally to a maximum width at an intermediate depth within the implanted substrate. The location of peak concentration of implanted ions extends along a line 126–126', which is generally at or near the maximum width portion of the profile 120. The two-dimensional profile can be characterized by a projected range Rp, a projected standard deviation along the X direction $\Delta Rp$, and a projected standard deviation along the Y direction $\Delta Y$. These distances are characteristic of the ion implantation process and are influenced by the particular ion, the substrate, the energy of the implanted ions and the range of variations in the energy of the ions. It is believed that the amorphous zone profile has the same general shape as the implantation concentration profile, where the size of the amorphous zone is determined by a threshold energy.

Figure 9:
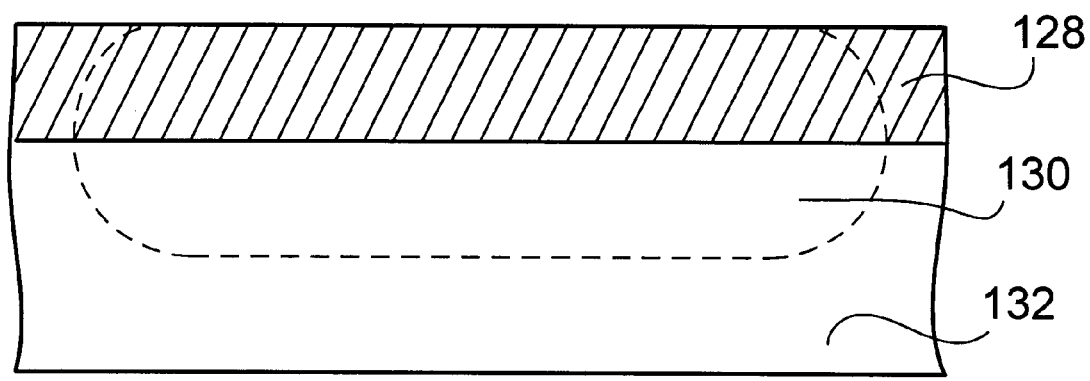
FIG. 9 shows a cross-sectional view of a substrate with a surface layer through which implantation is carried out.
Figure 10:
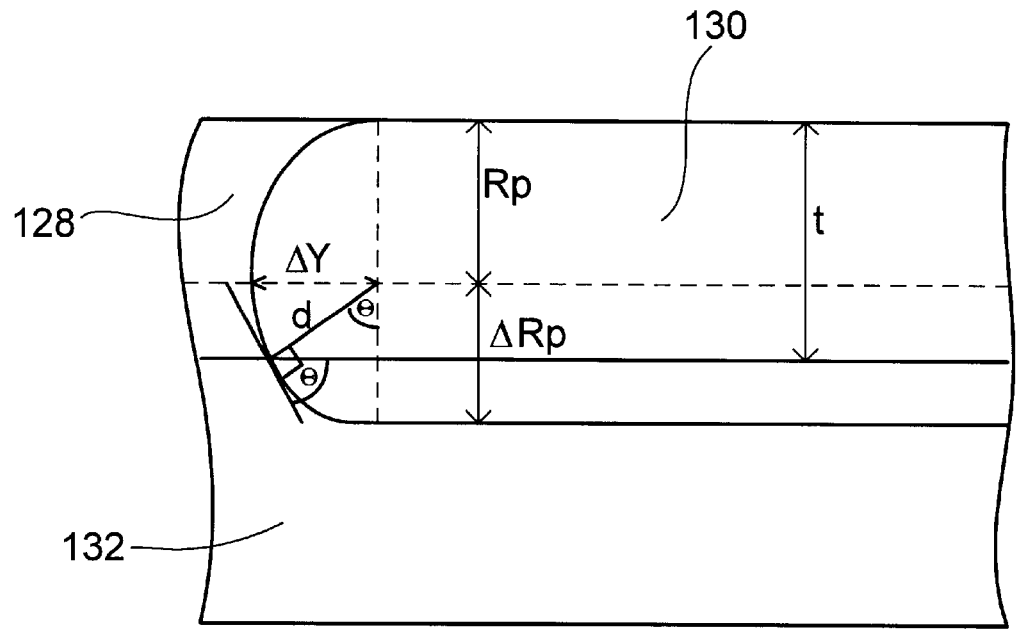
FIG. 10 shows various dimensions related to implantation through a surface layer and into a substrate.

To control the amorphous zone so that, upon recrystallization, regrowth occurs in directions which inhibit the formation of edge defects, the implantation may be carried out through a substantially uniform thickness surface layer 128 as seen in FIG. 9, with a portion of the implantation distribution 130 located in the surface layer 128, and a portion of the implantation distribution 130 located in the substrate 132. The surface layer may be formed from a wide variety of materials, such as, for example, polysilicon, other conductors such as refractory metal or silicides, silicon oxide and various glass compositions. When the invention is applied to the bit line contact region, it is particularly preferred that the surface layer be a conductor such as polysilicon, a refractory metal such a titanium, tungsten, tantalum or a silicide of a refractory metal. In this way, the surface layer need not be removed prior to forming the rest of the bit line contact. The present inventor has observed that for certain embodiments edge defect formation is minimized when the intersection between regrowth directions is 54.7 degrees or less. In order to determine a desired surface thickness layer t, the spatial distribution of the implant profile is assumed to be approximated by an elliptical contour. The right triangle formed by the radius of the ellipse at $\theta=54.7$ degrees, the bottom of the surface layer 128 and the edge of the implantation distribution 130 can be utilized to determine the minimum thickness t for the surface layer 128 disposed on the substrate 132. As seen in FIG. 10, the radius d of the ellipse at $\theta=54.7$ degrees is determined by the following equation:

$$d=[(\Delta Y \sin \theta)^2+(\Delta Rp \cos \theta)^2]^{0.5} \qquad (1)$$

where $\Delta Y$ is the projected standard deviation along the y-direction and $\Delta R_p$ is the projected standard deviation along the x-direction. In addition:

$$t-Rp=d\cos \theta \qquad (2)$$

where $R_p$ is the projected range of implantation depth, and solving for thickness t:

$$t=d\cos \theta+Rp \qquad (3)$$

Substituting the equation for radius d from above:

$$t=Rp+\cos \theta[[(\Delta Y \sin \theta)^2+(\Delta Rp \cos \theta)^2]^{0.5}] \qquad (4)$$

When $\theta=54.7$ degrees:

$$t=Rp+0.578[[(\Delta Y)^2(0.666)+(\Delta Rp)^2(0.334)]^{0.5}] \qquad (5)$$

The values for Rp, $\Delta Y$ and $\Delta Rp$ are dependent on the energy utilized for implantation. Published results for certain elements are set forth in Table 1. The minimum surface layer thickness t for a number of ion species with various ion implant energies are calculated and have the values set forth in Table 1.

TABLE 1

Published values for Rp, $\Delta Y$ and $\Delta Rp$ in angstroms and the calculated values for surface layer thickness t in angstroms for As, B, P and Sb ions implanted into a silicon substrate at 20, 40, 60 and 80 KeV.

| Energy (KeV) | | 20 | 40 | 60 | 80 |
|---|---|---|---|---|---|
| As | Rp (Å) | 150 | 262 | 368 | 473 |
| | $\Delta Rp$ | 56 | 96 | 133 | 169 |
| | $\Delta Y$ | 41 | 69 | 96 | 121 |
| | t | 177 | 308 | 431 | 553 |
| B | Rp | 658 | 1277 | 1847 | 2380 |
| | $\Delta Rp$ | 270 | 423 | 526 | 605 |
| | $\Delta Y$ | 290 | 483 | 638 | 761 |
| | t | 822 | 1545 | 2195 | 2792 |
| P | Rp | 253 | 488 | 729 | 974 |
| | $\Delta Rp$ | 114 | 201 | 288 | 367 |
| | $\Delta Y$ | 94 | 175 | 249 | 323 |
| | t | 311 | 594 | 881 | 1170 |
| Sb | Rp | 130 | 220 | 299 | 375 |
| | $\Delta Rp$ | 39 | 68 | 92 | 115 |

TABLE 1-continued

Published values for Rp, ΔY and ΔRp in angstroms and the calculated values for surface layer thickness t in angstroms for As, B, P and Sb ions implanted into a silicon substrate at 20, 40, 60 and 80 KeV.

| Energy (KeV) | 20 | 40 | 60 | 80 |
|---|---|---|---|---|
| ΔY | 30 | 49 | 66 | 82 |
| t | 149 | 252 | 343 | 430 |

Table 1. Published values for Rp, ΔY and ΔRp in angstroms and the calculated values for surface layer thickness t in angstroms for As, B, P and Sb ions implanted into a silicon substrate at 20, 40, 60 and 80 KeV.

It will be appreciated that, while the listed thickness t in Table 1 is a minimum value for avoiding formation of extended defect structures, t will also often be an optimum thickness. Due to normal processing variations, there will often be a variation in surface layer thickness. In most cases, the surface layer thickness t will have a variation of about 10% or less. For a given implantation energy, as the surface layer thickness t gets larger, the total implantation dose into the substrate becomes smaller and has less effect on the conductivity of the contact region. Accordingly, it is typically desirable to maintain the surface layer thickness at a small value if possible, although this is a less sensitive factor in overall device performance.

As seen in Table 1, for an implantation of As ions using an energy of 20 keV, for example, the thickness of the surface layer 128 of FIG. 10 should be at least approximately 177 angstroms. Using a surface layer at least 177 angstroms in thickness, the formation of mask edge defects will be reduced because the angle between the [100] direction and crystalline regrowth directions will be 54.7 degrees or less. The shape of the resulting amorphous region will control the regrowth directions so that the formation of defects including MEDs from interactions between vertical and lateral SPE regrowth will be minimized. Other embodiments of the present invention may provide different values for θ, depending, for example, on the substrate orientation and/or crystal structure.

Figure 11:
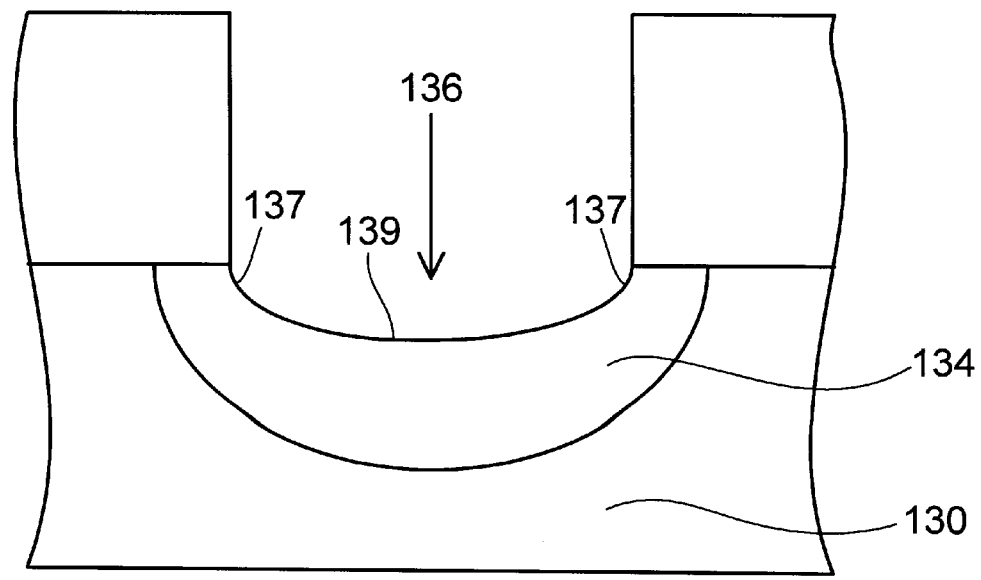
FIG. 11 shows a cross-sectional view of a substrate with a curved surface portion according to embodiments of the present invention.

Embodiments of the present invention may utilize a variety of substrate surface and surface layer morphologies. For instance, a substrate may be initially formed with a depression in its surface. Alternatively, a substrate having a generally flat surface may be subjected to processing steps to remove material to form a depression. As seen in FIG. 11, for example, a substrate 130 may have a depression 136 in order to yield an implantation zone 134 having an interface with a shape similar to that of the depression 136. The implantation zone 134 shown in FIG. 11 leads to certain advantages due to the geometry of the regrowth front during recrystallization. The angle between the amorphous implantation zone 134 and the crystalline region of the substrate 130 can be modified by controlling the curvature of the depression 136. By controlling the curvature one can minimize the interactions between vertical and lateral SPE regrowth during recrystallization. Certain embodiments of the invention have a depression extending below the original flat surface of the substrate, the depression defined by inwardly sloping sidewall regions 137 and a more flattened or flat central region 139 as shown in FIG. 11.

The depression 136 in the substrate 130 may be formed, for example, by carrying out an isotropic etch step after a bit line contact opening has been formed to the existent source/drain region of the transfer FET. In certain preferred embodiments, the depression may be concave shaped over at least a portion of its length, and may be fully curved along its length or may be curved at either end with a generally flat region in the middle. Depending on the etchant or etchants used, the substantially concave shaped surface may have a more flattened or a more curved appearance. The depression formed may undercut the sidewalls of the insulating layer which extends above the bit line contact. In certain embodiments, a goal is to avoid steep surface angles. After the etch step is completed, implantation is carried out to form resultant implantation zone 134. The implantation zone 134 will have an interface with the rest of the substrate that is similar in geometry to the curved surface 136, which will result in minimal defect pinning interactions between lateral and vertical solid phase epitaxial regrowth regions. As a result, defect formation will be reduced.

Figure 12:
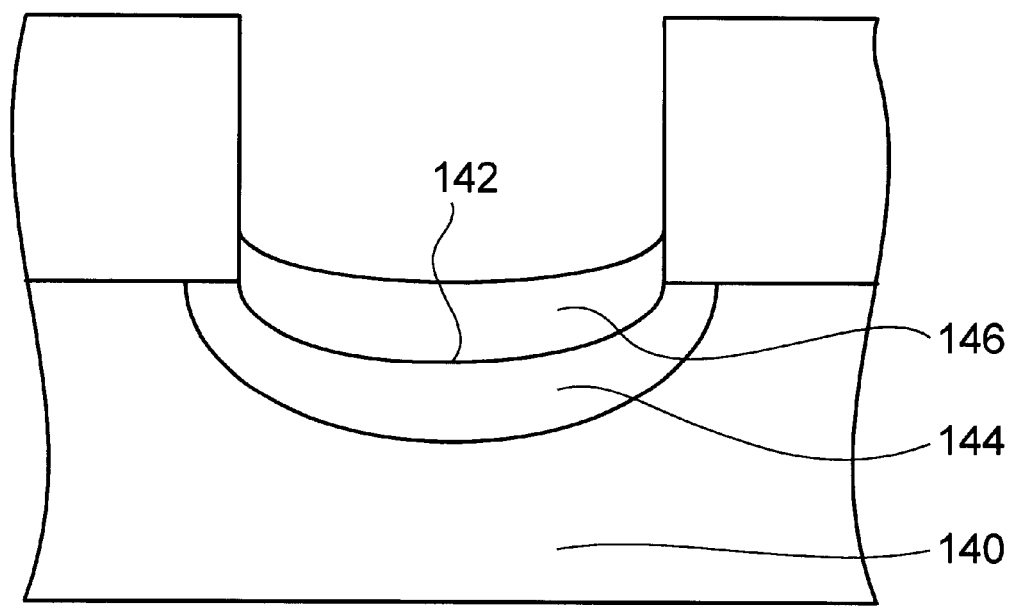
FIG. 12 shows a cross-sectional view of a substrate with a curved surface and a curved surface layer according to embodiments of the present invention.
Figure 13:
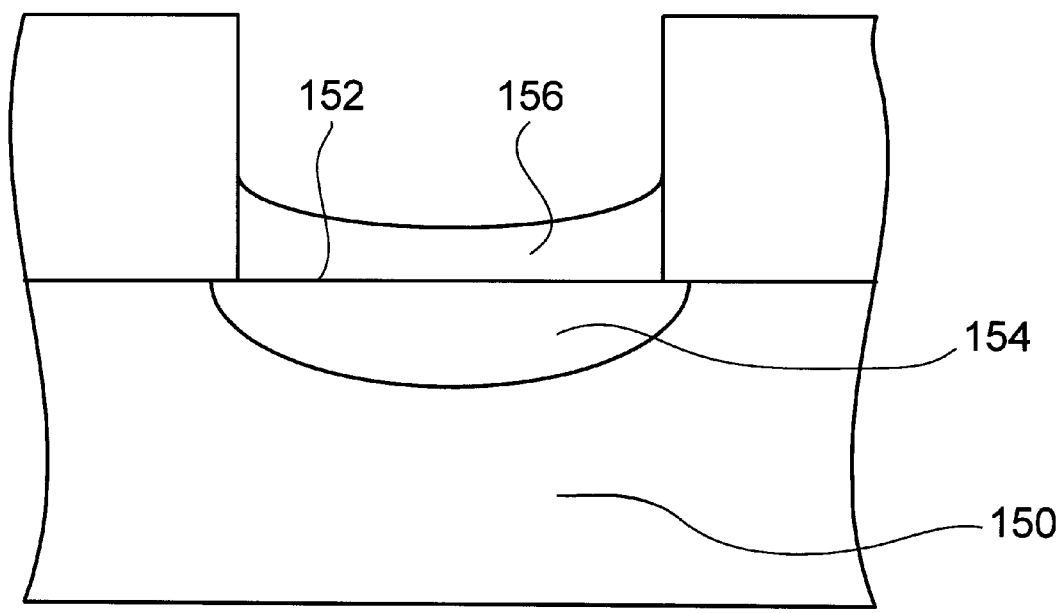
FIG. 13 shows a cross-sectional view of a substrate with a generally flat surface and a curved surface layer according to embodiments of the present invention.

To further control the shape and/or depth of an implantation zone, a surface layer 146 may be placed on top of a substantially concave shaped surface 142 of a substrate 140 prior to implantation, as seen in FIG. 12. Alternatively, a device similar to that shown in FIG. 12 may have a generally flat substrate surface 152 that has a generally concave shaped surface layer 156 placed thereon as seen in FIG. 13. Such a curved surface layer 156 can be formed, for example, by depositing a generally flat surface layer over the substrate and then etching a portion of the surface layer using an isotropic etchant. Subsequent implantation will result in an implantation zone 154 in the substrate 150, with the interface between the amorphous implantation zone 154 and the crystalline substrate 150 being curved in a similar manner to the curvature of the surface layer 156.

Figure 14:
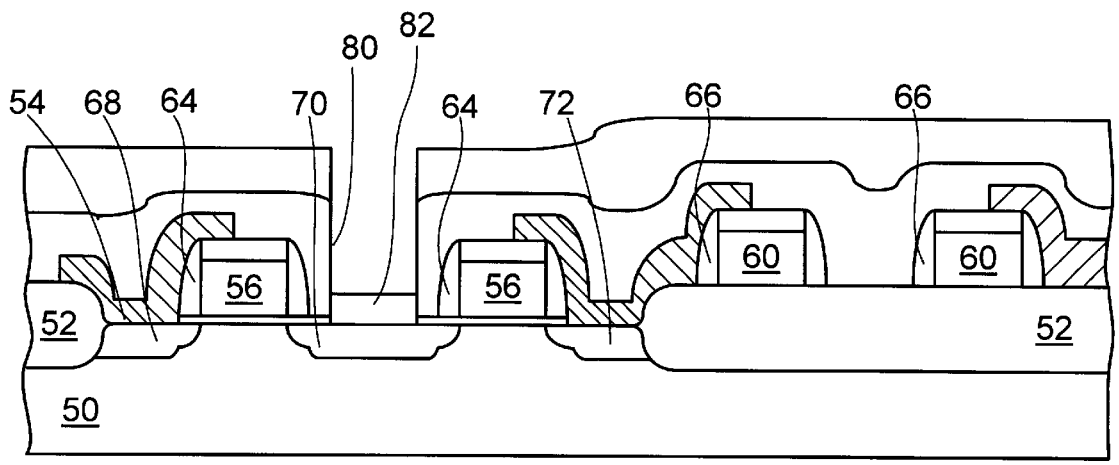
FIG. 14 shows a cross-sectional view of a DRAM in an intermediate stage of processing according to embodiments of the present invention.

An example of a DRAM device manufactured in accordance with embodiments of the present invention is shown in FIG. 14. The illustrated DRAM cells are formed on a P-type substrate 50 and include field oxide regions 52 for insulation from adjacent memory cells. Polysilicon gate electrodes 56 are formed on gate oxide layer 14. Lightly doped sourceldrain regions 68, 70 and 72 are formed on either side of the polysilicon gate electrodes 56 to define the channel regions of the transfer FETs. The source/drain region 70 that is common to the transfer FETs will serve as the bit line contact for the two illustrated transfer FETs. Doped source/drain regions 68, 70 and 72 may be formed in a two step process, first a relatively low level dopant implantation made self-aligned to the polysilicon gate electrodes 56. Sidewall spacer oxide regions 64 are then formed adjacent to the gate electrodes by depositing a layer of CVD oxide over the device and then anisotropically etching the oxide layer to expose the substrate over the source/drain regions 68, 70 and 72. Next a second, heavier ion implantation is made into the source/drain regions 68, 70 and 72, self-aligned to the spacer oxide regions 64. Wiring lines 60 which connect different gate electrodes are formed on field oxide regions 52 at the same time that the gate electrodes 56 are formed. Similarly, sidewall oxide spacer structures 66 are formed alongside wiring lines 60 at the same time that the sidewall oxide spacer structures 64 are formed.

After the transfer FETs are formed, storage capacitors and bit line contacts are formed. According to embodiments of the present invention, a bit line contact may be opened through the device to expose the source/drain region 70 through opening 80 using a technique such as photolithography and anisotropic etching to the source/drain surface. Then a surface layer 82 is deposited on the surface of the source/drain region 70 through which an implantation step is carried out in order to further enhance the conductivity of the bit line contact. The thickness of the surface layer will be related to the extent to which one wants to limit the directions of regrowth and may be determined using equations 1.1–1.5 above. One or more annealing steps are subsequently carried out to activate the implanted ions and to recrystallize the amorphous zone. The surface layer 82 is preferably removed prior to the formation of the bit line contact 84 in the opening 80 when an insulator is used as surface layer 82. In other embodiments in which a conductive material is used to form layer 82, it may be preferred to leave the material in place to reduce the number of processing steps. The bit line contact 84 (see FIG. 15) may consist of one or more layers of metal sputtered or CVD deposited within the opening 80 and over a portion of the device.

Figure 16:
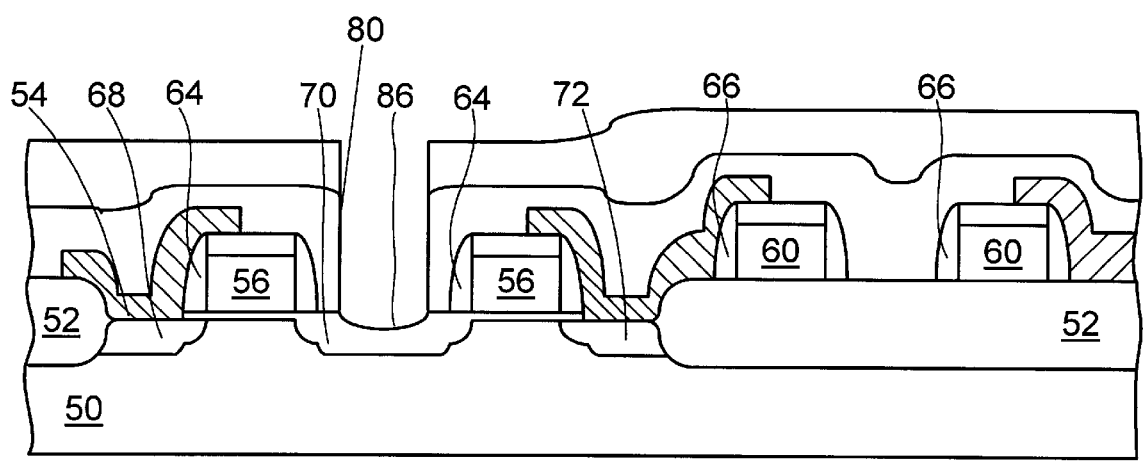
FIG. 16 shows a cross-sectional view of a DRAM in an intermediate stage of processing having a curved surface for implantation through according to embodiments of the present invention.

In another embodiment, a DRAM structure similar to that shown in FIG. 16 may be formed having a surface 86 that has a curved morphology through which implantation takes place, in order to control the shape of the implantation zone. Such a structure may be formed by first masking and using an anisotropic etchant to etch a portion of the opening 80. After the anisotropic etch step, the bottom of the opening 80 will have a relatively flat surface. Another etch step is then carried out using an isotropic etchant such as a plasma derived from $SF_6$ to form the curved surface 86, as illustrated in FIG. 16. By implanting through the curved surface 86, the implantation zone desirably has a similarly curved boundary so that upon annealing, recrystallization will occur along directions that minimize the formation of edge defects.

The DRAM of FIG. 14 could also have a surface layer through which implantation is carried out similar to the surface layer 136 shown in FIG. 12. Such a curved surface layer could be obtained by, for example, etching the surface as described above with respect to FIG. 16 and then depositing the surface layer on the curved surface. The desired minimum thickness of such a surface layer can be determined using equations 1–5 above. Likewise, the DRAM substrate could also have a generally flat substrate surface with a curved surface layer similar to the surface layer 156 shown in FIG. 13. Embodiments requiring numerous processing steps including, for example, multiple etching steps for the substrate surface and the surface layer, are generally not preferred due to the additional complexity and time entailed to perform the steps.

Figure 15:
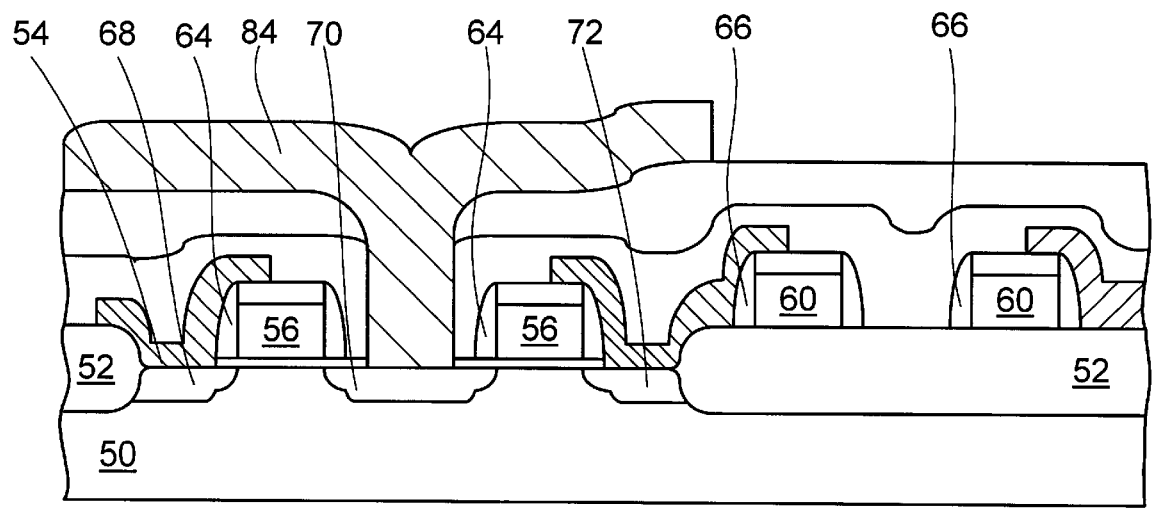
FIG. 15 shows a cross-sectional view of a DRAM including a bit line contact formed according to embodiments of the present invention.

While the methods for inhibiting defect formation have been described herein with respect to structures such as the DRAM in FIGS. 14–16, the methods described herein can be utilized with other structures and processing steps. For example, embodiments of the present invention can be applied to both mask or maskless (direct ion bean writing) implantation, as the implantation zone resulting from maskless implantation can have the same morphology as an implantation zone resulting from convention implantation using a mask. In addition, while the present invention has been described with reference to certain preferred embodiments, it is to be understood that the present invention is not limited to the particular embodiments described herein. Rather, the scope of the present invention is to be determined from the following claims:

What is claimed:

1. A method for inhibiting defect formation in a substrate subjected to ion implantation followed by annealing, comprising the steps of:

forming a first surface layer over at least a portion of the substrate, wherein the first surface layer has a thickness that is a minimum of about 10% smaller than a value t determined by:

choosing a desired angle θ between crystal regrowth directions;

determining a projected range of ion implantation distance Rp into the substrate;

determining a projected standard deviation ΔRp along a first axis direction;

determining a projected standard deviation ΔY along a second axis direction; and solving the following equation for t:

$$t = Rp + \cos\theta[[(\Delta Y \sin\theta)^2 + (\Delta Rp \cos\theta)^2]^{0.5}];$$

implanting ions into the substrate through the first surface layer; and annealing the substrate.

2. A method as in claim 1, wherein the first surface layer has a thickness that is within about 10% of the value t.

3. A method as in claim 1, wherein the first surface layer has a thickness of approximately the value t.

4. A method as in claim 1, further comprising:

providing the substrate with a concave surface region;

providing the surface layer with a concave surface layer portion; and implanting ions into the substrate through the concave surface layer portion and the concave surface region.

5. A method as in claim 1, further comprising providing a conducting material as the first surface layer.

6. A method as in claim 1, further comprising:

providing a first depression in the substrate; and implanting ions through the first depression into the substrate.

7. A method as in claim 6, further comprising:

providing a second depression in the surface layer; and implanting ions through the second depression and into the substrate.

8. A method as in claim 6, wherein the first depression includes a flat portion therein.

9. A method for inhibiting defect formation in a substrate subjected to ion implantation followed by annealing comprising:

providing a substrate having a surface;

removing material from the substrate surface by isotropically etching the surface to define a first region;

providing a surface layer on the first region, the surface layer having a substantially uniform thickness across the first region, wherein the minimum thickness of the surface layer is determined by:

choosing a desired angle θ between recrystalization directions, determining a projected range of ion implantation distance Rp into the substrate, determining a projected standard deviation ΔRp along a first axis direction, determining a projected deviation ΔY along a second axis direction, and solving the following equation for thickness t of the surface layer:

$$t = Rp + \cos\theta\{((\Delta Y \sin\theta)^2 + (\Delta Rp \cos\theta)^2)^{0.5}\};$$

implanting ions into the substrate through the first region; and annealing the substrate.

* * * * *